United States Patent [19]
Colin et al.

[11] 4,160,214
[45] Jul. 3, 1979

[54] MODULAR MODULATOR FOR RADAR TRANSMITTERS

[75] Inventors: Lucien Colin; André Chesnel, both of Paris, France

[73] Assignee: Thomson-CSF, Paris, France

[21] Appl. No.: 827,110

[22] Filed: Aug. 23, 1977

[30] Foreign Application Priority Data

Aug. 27, 1976 [FR] France ............... 76 25956

[51] Int. Cl.² ................................. H03K 1/00
[52] U.S. Cl. ........................ 328/65; 307/262; 325/67
[58] Field of Search ............ 307/265, 262, 351; 328/65, 67

[56] References Cited

U.S. PATENT DOCUMENTS

| | | | |
|---|---|---|---|
| 3,051,906 | 9/1962 | Haynes | 328/65 |
| 3,286,031 | 11/1966 | Geddes | 307/351 |
| 3,479,532 | 11/1969 | Kennedy | 328/67 |
| 3,578,986 | 5/1971 | McGuffin | 328/67 |
| 4,058,742 | 11/1977 | O'Brien | 328/67 |

Primary Examiner—Stanley D. Miller, Jr.
Assistant Examiner—B. P. Davis
Attorney, Agent, or Firm—Cushman, Darby & Cushman

[57] ABSTRACT

A modular modulator having a high voltage supply source and a separating circuit connected at its input to the high voltage supply source. The output of the separating circuit is connected to a pulse generating circuit which is itself connected by a coupling circuit to a transmission tube. The pulse generating circuit contains a plurality of elementary delay cells. The delay cells are each connected to the coupling circuit by means of at least one switching circuit and the electrodes for triggering the switching circuits are connected to a control circuit which emits signals in sequence at different predetermined times. Triggering the switching circuits enables thus by the discharge of the elementary cells a resultant signal made up of elementary pulses of predetermined length to be generated.

7 Claims, 5 Drawing Figures

MODULAR MODULATOR FOR RADAR TRANSMITTERS

BACKGROUND OF THE INVENTION

The present invention relates to a variable pulse-length modulator, in particular for radar transmitters, and to a radar incorporating such a modulator.

The modulators currently used in radars which employ pulsed emission may be divided into three main categories.

Modulators which are known as vacuum tube modulators employ a triode, or tetrode tube as their switching means. Such modulators allow pulses of continuously variable length to be generated, or a large number of pulses of differing duration. The low internal impedance of such devices enables them to be matched to loads of various kinds. However, such modulators have the drawbacks of high weigth and volume and poor reliability. In addition, the presence of a storage capacitor and the high voltage level employed in devices of this kind make it necessary to provide careful safeguards both for the equipment and the personnel using it.

Delay line modulators, because of the lower voltages employed, are of more reasonable dimensions, weight, volume and cost.

However, the capacity which such modulators have for adaptation to situations where varying pulse lengths and/or operating impedances are required is much more limited. What is more, whith a delay line of acceptable size the shape of the pulses is much less satisfactory than from a vacuum-tube modulator.

Magnetic modulators in which energy is stored in an inductance carrying a large DC current and is then released by interrupting this current, have the disadvantages that the pulse produced is unstable with time and that their efficiency is poor because of the conditions under which the inductance is charged.

SUMMARY OF THE INVENTION

The present invention enables the above mentioned disadvantages to be overcome.

One object of the present invention is to provide a modulator which is extremely versatile as regards the duration of the signal or pulses which it delivers, the pulses being capable of emission in bursts or in a predetermined sequence.

Another object of the present invention is to provide a highly reliable modulator of small size.

A third object of the invention is to provide a modulator which delivers pulses of variable duration whose stability is comparable with that of the pulses delivered by vacuum-tube modulators.

The modular modulator which is the subject of the present invention includes a separating circuit whose input is connected to a high-voltage supply source and whose output is connected to a pulse generating circuit coupled to a transmission tube which forms the transmitter, the said pulse generating circuit consisting of a plurality of elementary delay cells which can be switched individually and which apply a predetermined delay, thus enabling a resultant signal to be generated which is made up of elementary pulses of predetermined length each corresponding to the delay from one of the elementary cells, the said elementary delay cells each being connected to the coupling circuit of the tube by means of at least one switching circuit whose triggering electrode is connected to a control circuit which emits triggering signals in sequence at different predetermined times.

Such modulators may be used in particular in the transmitters of radars which employ pulsed emission, in linear accelerators, or in laser emission devices.

BRIEF DESCRIPTION OF THE DRAWINGS

The invention will be better understood from the description and the accompanying drawings, in which:

In FIG. 1, the modulator which is the subject of the present invention has a high-voltage supply source 1, which is connected to a pulse generating circuit 3 via separating circuit 2. The separating circuit 2 is, for example, formed in conventional fashion by a doubler inductance connected in series with a diode which provides protection for the supply source when pulses are generated by circuit 3. The pulse generating circuit 3 is coupled to a microwave transmitting tube 5, in the case of a radar for example, via a coupling circuit 4 such as a transformer.

Figure 1:
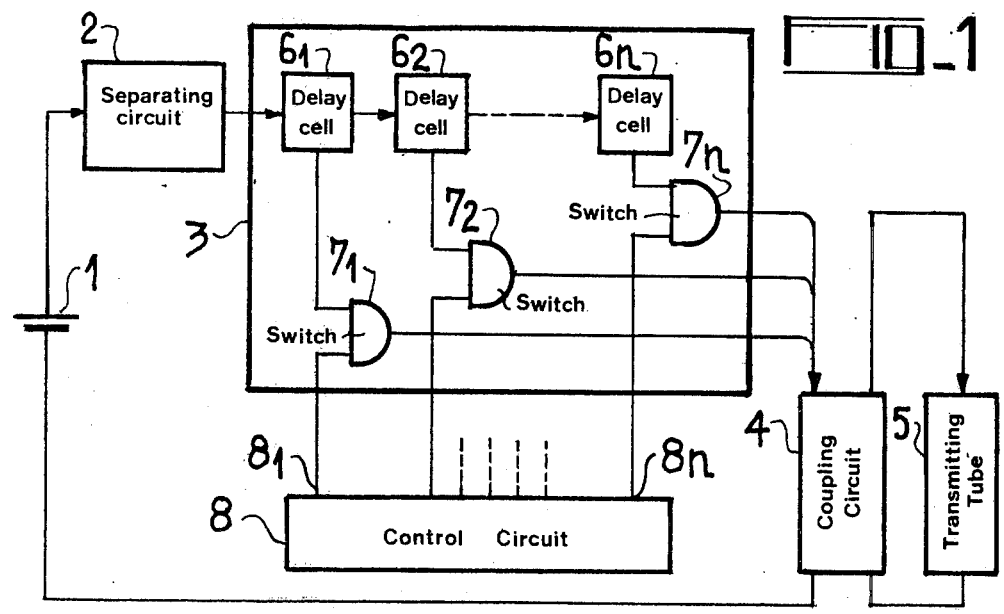
FIG. 1 is a block diagram of the subject of the present invention.

In accordance with the invention, the pulse generating circuit 3 consists of a plurality of elementary, switchable delay cells 61 to 6n which are each capable of contributing towards the generation of a resultant signal made up of elementary pulses of lengths $\tau 1$ to $\tau n$, each corresponding to the delay from one of the elementary cells. In accordance with the invention, the elementary delay cells, which are individually switchable and are connected in series or in parallel, are each connected to the coupling circuit 4 by at least one switching circuit 71 to 7n.

In accordance with the invention the switching circuits 71 to 7n have their triggering electrodes connected to outputs 81 to 8n of a control circuit 8. The control circuit 8 consists of a selecting register (not shown) which enables to select the times of triggering of each of the switching circuits 71 to 7n in relation to the radar repetition signal. For this purpose, the control circuit 8 emits triggering signals from each of its outputs 81 to 8n at different predetermined times in the repetition cycle of the radar, as dictated by the choice made at the selecting register. In accordance with the invention the triggering of the switching circuits at the said predetermined times in the radar repetition cycle enables a succession of elementaty pulses of length $\tau 1$ to $\tau n$ to be generated, or when the times at wich the successive elementary pulses are triggered coincide with the ends of the preceding pulse, a single pulse whose length is equal to the sum of the length of the selected individual pulses.

Figure 2:
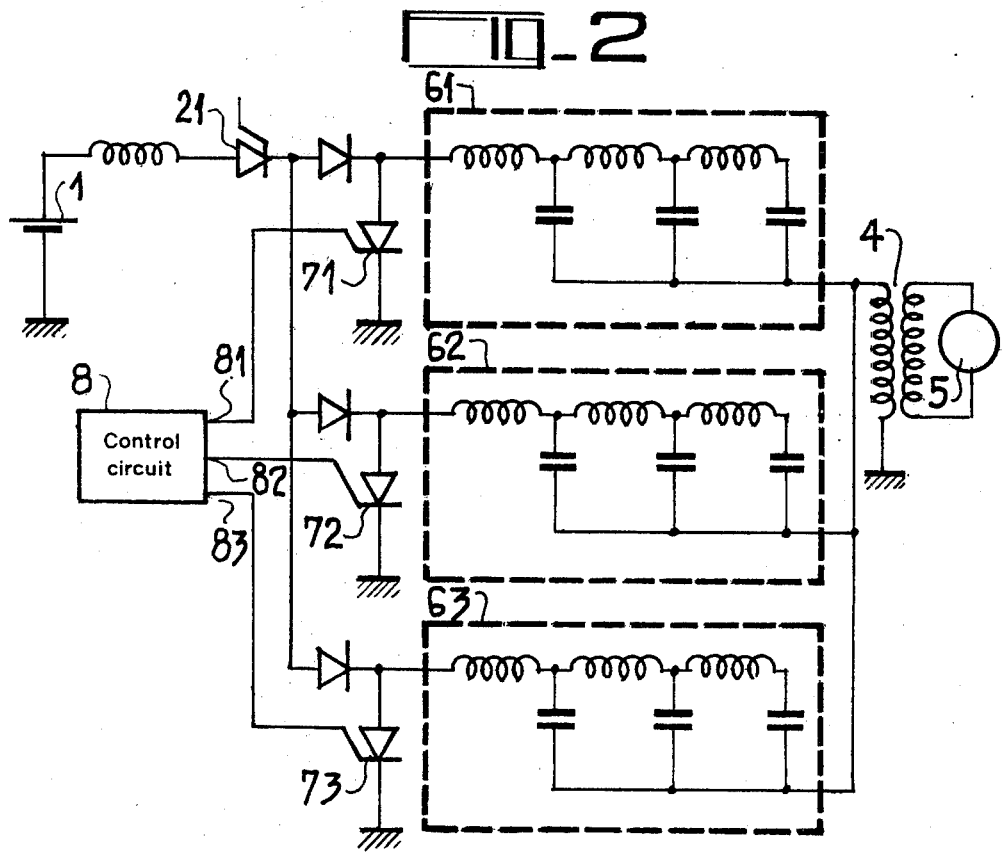
FIG. 2 shows a particular embodiment of the subject of the present invention.

In a particular embodiment which is shown in FIG. 2, the modulator which is the subject of the invention may, by way of nonlimiting example, contain three elementary delay cells 61, 62, 63. These three cells are connected in parallel between the separating circuit and the coupling circuit 4. Each of the elementary constants whose values allow corresponding elementary pulses of lengths τ1, τ2 and τ3, to be generated in a known fashion. Each of the elementary delay cells has one of its terminals connected to the separating circuit 2. This terminal is also connected to the coupling circuit 4 through switching circuit 71, 72 or 73. The coupling circuit 4 is formed by a transformer. Each elementary delay cell has a first terminal which is connected to the separating circuit 2 and which is also connected via a switching circuit 71, 72, 73 to a first terminal of the primary winding of the transformer 4, and a second terminal which is connected to a second terminal of the primary winding of the same transformer. The switching circuits 71, 72, 73 are formed by thyristors whose control electrodes are directly connected to corresponding outputs 81 to 83 of the control circuit 8. Each of the switching circuits 71 to 73 and each of the elementary delay cells 61 to 63 enable a pulse of length τ1 to τ3, whose power is sufficient to trigger the transmission tube 5, to be generated by the discharge of the individual cells. Triggering each of the switching circuits at various different times in one repetition cycle of the radar enables a combination of elementary pulses of lengths τ1, τ2, τ3 in accordance with a particular code or alternatively enables a pulse of total duration τ1+τ2+τ3 to be emitted.

The period between the last pulse generated or the end of the resulting signal and the end of the radar repetition cycle is equal to or greater than the recharging time of the delay lines. For this purpose, the apparatus contains, in the separating stage, a switch such as a tryristor 21 which prevents the delay lines from being charged until after a predetermined delay has elapsed from the end of the resulting signal in order to assist in the turn off of the switching thyristors.

Figure 3:
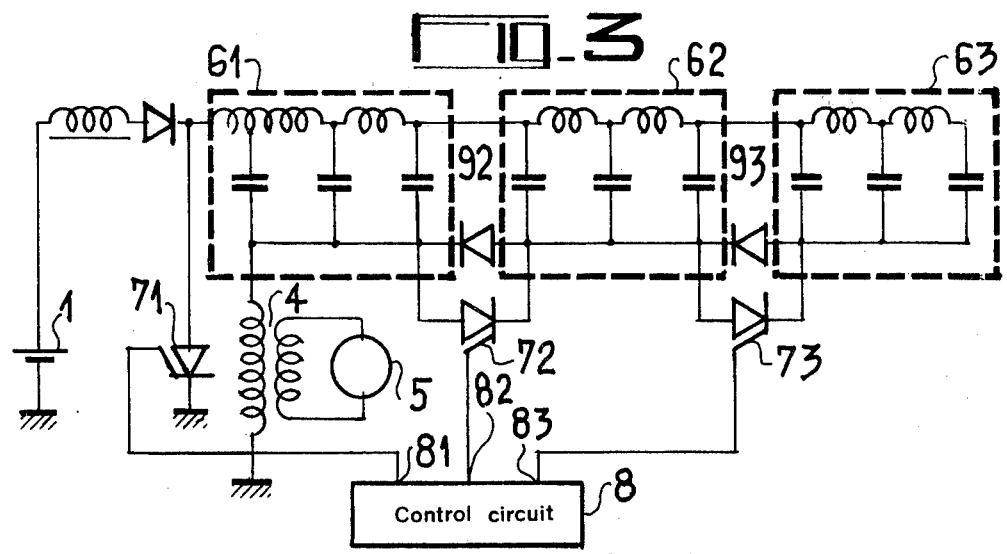
FIG. 3 shows a detail of the embodiment of the invention as illustrated in FIG. 1.

In another particular embodiment which is shown in FIG. 3, the apparatus which is the subject of the present invention contains three elementary delay cells 61, 62, 63 which each represent a predetermined delay and which enable a resulting signal to be generated which is made up of elementary pulses of lengths τI, τ2, τ3. In the embodiment of FIG. 3, the elementary cells 61, 62, 63 are connected in series and are isolated from one another by switching circuits 72, 73. Each elementary delay cell is connected to the coupling circuit formed by a transformer by means of at least one switching circuit 71, 72, 73 whose triggering electrode is connected to an output 81, 82, 83 of the control circuit 8. The switching circuits are advantageously formed by thyristors. Diodes 92, 93 which are connected in antiparallel to the thyristors 72, 73 enable the circuits for charging the capacitors in the elementary delay cells to be closed. By triggering the switching means or thyristors 71, or 71 and 72, or 71 and 72 and 73, it is possible to produce resulting signals of lengths τ1, τ1+τ2, τ1+τ2+τ3 respectively. These pulses are spaced apart by one repitition period of the radar but wich the possibility of a sligth variation in the latter about its mean value.

When only one elementary cell is in use, the adjacent switching circuit is subject to a considerable variation in voltage because of the triggering of the neighboring switching circuit. Capacitors at the terminals of the switching circuits enable the size of this variation in voltage to be limited.

Figure 4:
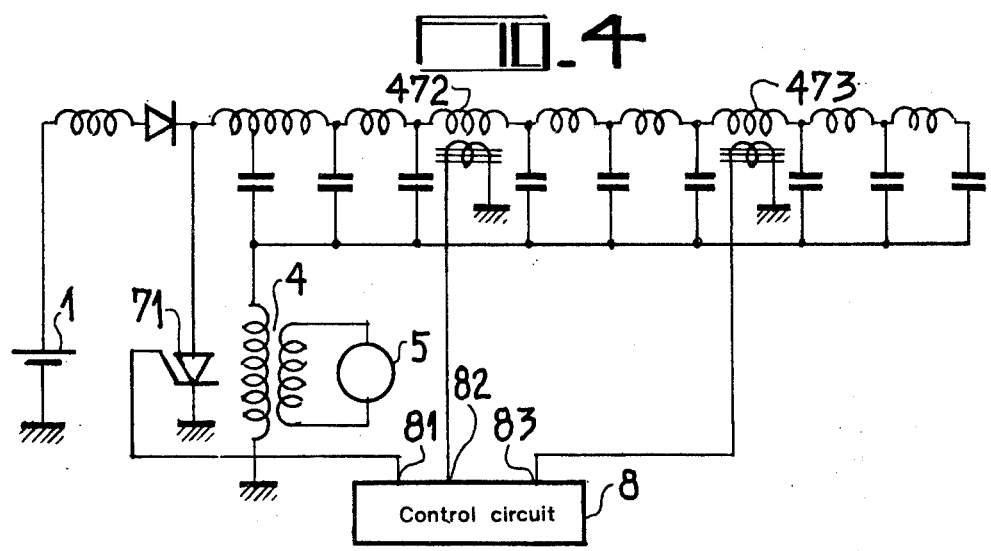
FIG. 4 shows another particular embodiment of the subject of the invention.

In FIG. 4 the thyristors which link the elementary cells connected in series, as shown in FIG. 3, are replaced by a winding wound on a saturable magnetic core 472, 473. The control windings for these magnetic cores are connected to outputs 82, 83 of the control circuit 8.

In the saturated state the inductance of this member is close to the normal value of the inductance of a section of line. In the unsaturated state the member is of a high inductance, several hundreds of times greater than it inductance in the saturated state, and isolates the sections of line from one another. The operation of the modulator shown in FIG. 4 is similar to that of the modulator shown in FIG. 3.

If a resistance/capacitance peak-clipping circuit is employed with the foregoing pieces of apparatus it enables the pulses to be shaped and also allows the instability waves which appear in the resulting signal and which are caused by the summing of the individual pulses to be suppressed. The peak-clipping circuit also ensures that the characteristics of the resultant emitted signal are highly stable.

Figure 5:
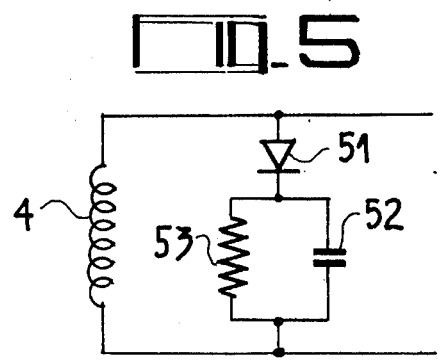
FIG. 5 shows a detail of the apparatus which is the subject of the invention.

The peak-clipping circuit which is shown in FIG. 5 consists of a diode 51 connected in series with a capacitor 52 and a resistors 53 connected in parallel. The peak-clipping circuit is preferably connected in parallel between the output terminals of the coupling 4, i.e. the secondary terminals of the transformer 4.

The arrangements described above allow the number of circuits and their size to be optimized for a given peak transmission power. By way of example, the modes usable for transmission may consist of a mode number one where the pulse length is τ and the repetition frequency FR in one transmission cycle, a mode number two where the pulse length is 3 τ and the repetition frequency FR/3, and a mode number three where the pulse length is 6 τ and repetition frequency FR/6.

A first possibility, as illustrated by the diagram in FIG. 2, consists in using three modulators in parallel which emit pulses of lengths τ, τ3, τ6 respectively.

If the peak transmitted power is such that each modulator needs to use N modules in parallel, the number of thyristors Th, of individual delay cells T and of modules M required will be 3NTh, 10NT, 3NM for an arrangement as illustrated in FIG. 2.

Another possibility would be to use in parallel N modulators comprising elementary delay cells in series whose delay corresponded to pulses of lengths τ, 2τ, 3τ, so as to provide the three required lengths τ, 3τ, 6τ. The three parameters defined above become 3NTh, 6NT and NM and this allows a considerable overall saving in size and equipment.

A third possibility using the layout shown in FIG. 2 is, as in the first possibility, to connect in parallel three modulators which are triggered one after the other or separately and in which the delays from the individual cells correspond respectively to pulses of length τ, 2τ, 3τ. The three parameters become 3NTh, 6NT, and 3NM. The second possibility but it has the great advantage of increased versatility since pulses of length 4τ and 5τ may be produced in addition to ones of lengths τ, 3τ, and 6τ. By coding from the control circuit 8 it is possible to produce for example, at intervals separated by a maximum of 1/FR, the sequences τ, 2τ; τ, 3τ; 2τ, 3τ; 3τ, 3τ; 4τ, 2τ; 5τ, τ and all the reverse combinations.

A combination of modulators as illustrated in FIG. 2 and 3 does not exceed the scope of the present invention. It is in fact possible to produce, for example, a general layout consisting of two modulators in parallel the first having two elementary delay cells in series corresponding to pulses of length τ and 2τ, and the second containing two elementary cells in series corresponding to pulses of identical length 4τ.

In this case the following combinations can be obtained: τ, 4τ; τ, 8τ; 3τ, 4τ; 3τ, 8τ by coding and τ, 3τ, 4τ, 5τ, 7τ, 8τ, 9τ, 11τ in normal repetition cycles.

The size parameters then become: 4NTh, 4NT, 2NM.

It can be seen that versatility in use is achieved by using an arrangement according to the invention.

There has thus been described a modulator which allows ease of operation and a gain in size which previously could only be contemplated with the help of heavy, expensive and somewhat unreliable pieces of equipment.

What we claim is:

1. A modular modulator for use in a transmitter of the type including a power supply, a modulator generating pulses, a separating circuit coupling power from said power supply to said modulator, a transmission tube, and a coupling circuit carrying pulses from said modulator to said transmission tube, said modular modulator comprising:
   a plurality of elementary delay cells, each having first and second terminals and each having a predetermined delay associated therewith, said elementary delay cells being coupled in switchable parallel relationship between said separating circuit and said coupling circiut, said second terminal of each of said elementary delay cells being coupled to said coupling circuit;
   a diode element associated with each of said elementary delay cells, coupling said separating circuit to said elementary delay cell and arranged with polarity such that power flows from said separating circuit to said elementary delay cell, and not from said elementary delay cell to said separating circuit;
   an electronic switching element associated with each of said elementary delay cells, each element having an input electrode, an output electrode and a control gate associated therewith, said input electrode coupled to said first terminal of said elementary delay cell and said output terminal coupled to said coupling circuit such that the activation of said control gate controls the coupling of said first terminal of said elementary delay cell to said coupling circuit; and
   a control circuit for generating gate control pulses, said control circuit having outputs coupled to each of said control gates of said electronic switching elements such that the relative timing of said gate control pulses controls the coupling of each of said elementary delay cells to said coupling circuit, permitting the independent control of loading and discharge of each of said elementary delay cells in order to generate pulses having desired pulse width and desired timing.

2. The modular modulator of claim 1 further including a peak clipping circuit coupled in parallel to the output of said coupling circuit.

3. A modular modulator for use in a transmitter of the type including a power supply, a modulator generating pulses, a separating circuit coupling power from said power supply to said modulator a transmission tube, and a coupling circuit carrying pulses from said modulator to said transmission tube, said modular modulator comprising:
   a plurality of elementary delay cells, each having a predetermined delay associated therewith and arranged in series fashion so as to include a first cell, and a last cell, of said series;
   electronic switching means coupling said first cell to said coupling circuit, said electronic switching means having a control gate;
   a plurality of switching circuits each having a control gate, one such switching circuit coupling each elementary delay cell to its adjacent cell, said switching circuits providing either isolation or connection between adjacent cells such that after loading of said cells, any number of such cells can be discharged at a desired time to produce pulses of desired width and timing;
   a control circuit for generating gate control pulses, said control circuit having outputs coupled to each of said control gates of said electronic switching elements such that the relative time of said gate control pulses controls the series coupling of said elementary delay cells.

4. The modular modulator of claim 3 wherein each said switching circuit comprises a thyristor element and diode element in parallel and having opposite polarity to one another.

5. The modular modulator of claim 3 further including a peak clipping circuit coupled in parallel to the output of said coupling circuit.

6. The modular modulator of claim 3 wherein said switching circuits include inductive switching elements having at least one winding wound about a saturable core and wherein said first cell is coupled to said coupling circuit via thyristor switching means.

7. The modular modulator of claim 6 further including a peak clipping circuit coupled in parallel to the output of said coupling circuit.

* * * * *